US006806203B2

(12) United States Patent
Weidman et al.

(10) Patent No.: US 6,806,203 B2
(45) Date of Patent: Oct. 19, 2004

(54) METHOD OF FORMING A DUAL DAMASCENE STRUCTURE USING AN AMORPHOUS SILICON HARD MASK

(75) Inventors: Timothy Weidman, Sunnyvale, CA (US); Nikolaos Bekiaris, San Jose, CA (US); Josephine Chang, Carmichal, CA (US); Phong H. Nguyen, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/101,540

(22) Filed: Mar. 18, 2002

(65) Prior Publication Data

US 2003/0176058 A1 Sep. 18, 2003

(51) Int. Cl.[7] .............................................. H01L 21/302
(52) U.S. Cl. .......................... 438/736; 438/637; 438/638
(58) Field of Search ................................ 438/623, 715, 438/736, 624, 626, 627, 633, 634, 637, 638, 643

(56) References Cited

U.S. PATENT DOCUMENTS

| | | | |
|---|---|---|---|
| 5,661,344 A | | 8/1997 | Havemann et al. |
| 5,886,410 A | | 3/1999 | Chiang et al. |
| 5,935,762 A | * | 8/1999 | Dai et al. ................... 430/312 |
| 6,027,995 A | | 2/2000 | Chiang et al. |
| 6,054,379 A | | 4/2000 | Yau et al. |
| 6,071,809 A | * | 6/2000 | Zhao ........................... 438/634 |
| 6,127,263 A | | 10/2000 | Parikh |
| 6,168,726 B1 | | 1/2001 | Li et al. |
| 6,171,945 B1 | | 1/2001 | Mandal et al. |
| 6,174,451 B1 | | 1/2001 | Hung et al. |
| 6,204,168 B1 | | 3/2001 | Naik et al. |
| 6,225,207 B1 | | 5/2001 | Parikh |
| 6,232,235 B1 | * | 5/2001 | Cave et al. ................. 438/715 |
| 6,245,662 B1 | | 6/2001 | Naik et al. |
| 6,284,149 B1 | | 9/2001 | Li et al. |
| 6,287,990 B1 | | 9/2001 | Cheung et al. |
| 6,291,334 B1 | | 9/2001 | Somekh |
| 6,297,170 B1 | * | 10/2001 | Gabriel et al. ............... 438/738 |
| 6,303,489 B1 | | 10/2001 | Bass |
| 6,303,523 B2 | | 10/2001 | Cheung et al. |
| 6,350,675 B1 | * | 2/2002 | Chooi et al. ................. 438/624 |
| 6,350,700 B1 | * | 2/2002 | Shinella et al. ............. 438/723 |
| 6,368,979 B1 | * | 4/2002 | Wang et al. ................. 438/723 |
| 6,372,635 B1 | * | 4/2002 | Wang et al. ................. 438/638 |
| 6,448,177 B1 | * | 9/2002 | Morrow et al. ............. 438/638 |
| 6,479,391 B2 | * | 11/2002 | Morrow et al. ............. 438/706 |
| 6,514,852 B2 | * | 2/2003 | Usami ......................... 438/624 |
| 6,541,367 B1 | * | 4/2003 | Mandal ....................... 438/622 |
| 2001/0016405 A1 | | 8/2001 | Nguyen et al. |

FOREIGN PATENT DOCUMENTS

EP      1 154 468 A2     11/2001

OTHER PUBLICATIONS

R.D. Goldblatt et al., A High Performance 0.13 βm Copper BEOL Technology with Low–k Dielectric, *IEEE*, pp. 261–263 (Jun. 2000).

Chu et al., "Direct Patterning of Low–K Material for Damascene Process," *Mat. Res. Soc. Symp. Proc.*, 476:51–57 (1997).

(List continued on next page.)

*Primary Examiner*—Caridad Everhart
*Assistant Examiner*—Renzo Rocchegiani
(74) *Attorney, Agent, or Firm*—Townsend and Townsend and Crew (57) ABSTRACT

A method of forming a dual damascene structure on a substrate having a dielectric layer already formed thereon. In one embodiment the method includes depositing a first hard mask layer over the dielectric layer and depositing a second hard mask layer on the first hard mask layer, where the second hard mask layer is an amorphous silicon layer. Afterwards, formation of the dual damascene structure is completed by etching a metal wiring pattern and a via pattern in the dielectric layer and filling the etched metal wiring pattern and via pattern with a conductive material.

26 Claims, 8 Drawing Sheets

OTHER PUBLICATIONS

Hasegawa et al., "Copper Dual Damascene Interconnects with Low–K ($K_{eff}$<3.0) Dielectrics Using FLARE™ and an MSQ Hard Mask," sponsored by LSI Business & Technology Development Group, C.N.C. Sony Corporation.

Hayashi et al., "Process Dsign Methodology for Via–shape–controlled, Cu Dual–damascene Interconnects Tailored in Low–k Organic Film," *Technical Report of IBICE*, from Institute of Electronics (2001).

Hiroi et al., "Dual Hard Mask Process for low–k Porous Organosilica Dielectric in copper Dual Damascene Interconnect Fabrication," *IEEE*, (2001).

Kinoshita et al., "Process Design Methodology for Via–Shape–Controlled, Copper Dual–Damascence Interconnects in Low–k Organic Film," *IEEE*, 11.2.1–11.2.4 (2000).

Mosig et al., "Single and Dual Damascene Integration of a Spin–On Porous Ultra low–k Material," *IEEE*, (2001).

Suemasa et al., "Low–k Etch / Ash for copper Dual damascene," from *Challenges in Process Integration and Device Technology*, edited by Burnett et al., from *Proc. of SPIE*, 4182:281–286 (2000).

Yamamura et al., "Multilevel interconnects Technologies Using Cu and low–k Dielectrics," from The Institute of Electronics, Technical Report of IEICF, pp. 87–92 (2000).

Yamamura et al., "High Performance Copper Dual Damascene Interconnects Using an Organic Low–k Dielectrics," *Conf. Proc. ULSI XV*, presented by Materials Research Society, pp. 41–46 (2000).

\* cited by examiner

METHOD OF FORMING A DUAL DAMASCENE STRUCTURE USING AN AMORPHOUS SILICON HARD MASK

BACKGROUND OF THE INVENTION

The present invention relates to the fabrication of integrated circuits. Some specific embodiments of the invention pertain to a method for forming a dual damascene structure in an integrated circuit in which the etched dielectric layer(s) include one or more porous low dielectric constant films.

As semiconductor device sizes have become smaller and integration density increases, many issues have become of increasing concern to semiconductor manufacturers. One such issue is that of interlevel "crosstalk." Crosstalk is the undesired coupling of an electrical signal on one metal layer onto another metal layer, and arises when two or more layers of metal with intervening insulating or dielectric layers are formed on a substrate. Crosstalk can be reduced by moving the metal layers further apart, minimizing the areas of overlapping metal between metal layers, reducing the dielectric constant of the material between metal layers and combinations of these and other methods. Undesired coupling of electrical signals can also occur between adjacent conductive traces, or lines, within a conductive layer. As device geometries shrink, the conductive lines become closer together and it becomes more important to better isolate them from each other.

Another such issue is the "RC time constant" of a particular trace. Each conductive trace has a resistance, R, that is a product of its cross section and bulk resistivity, among other factors, and a capacitance, C, that is a product of the surface area of the trace and the dielectric constant of the material or the space surrounding the trace, among other factors. If a voltage is applied to one end of the conductive trace, charge does not immediately build up on the trace because of the RC time constant. Similarly, if a voltage is removed from a trace, the trace does not immediately drain to zero. Thus high RC time constants can slow down the operation of a circuit. Unfortunately, shrinking circuit geometries produce narrower traces, which results in higher resistivity. Therefore it is important to reduce the capacitance of the trace, such as by reducing the dielectric constant of the surrounding material between traces, to maintain or reduce the RC time constant.

Hence, in order to further reduce the size of devices on integrated circuits, it has become necessary to use insulators that have a lower dielectric constant than the insulators of previous generations of integrated circuits. To this end, semiconductor manufacturers, materials suppliers and research organizations among others have been researching and developing materials for use as premetal dielectric (PMD) layers and intermetal dielectric (IMD) layers in integrated circuits that have a dielectric constant (k) below that of silicon dioxide (generally between about 3.9–4.2) and below that of fluorine-doped silicate glass (FSG, generally between about 3.4–3.7). These efforts have resulted in the development of a variety of low dielectric constant films (low k films). As used herein, low k films are those having a dielectric constant less than about 3.0 including films having a dielectric constant below 2.0.

Some approaches to developing such low k films include introducing porosity into known dielectric materials to reduce the material's dielectric constant. Dielectric films when made porous, tend to have lower dielectric constants (the dielectric constant of air is normally 1.0). One particular class of porous low k films includes ordered mesoporous silica materials. One known method of forming such ordered mesoporous silica films is referred to as the sol gel process, in which high porosity films are produced by hydrolysis and polycondensation of a metal oxide.

The sol gel process is a versatile solution process for making ceramic material. In general, the sol gel process involves the transition of a system from a liquid "sol" (mostly colloidal) into a solid "gel" phase. The starting materials used in the preparation of the "sol" are usually inorganic metal salts or metal organic compounds such as metal alkoxides. The precursor solutions are typically deposited on a substrate by spin on methods. In a typical sol gel process, the precursor is subjected to a series of hydrolysis and polymerization reactions to form a colloidal suspension, or a "sol." Further processing of the "sol" enables one to make ceramic materials in different forms. One method of forming such mesoporous low k films is described in U.S. application Ser. No. 09/823,932, filed on Mar. 29, 2001 in the name of Robert P. Mandel et al. and assigned to Applied Materials, Inc., the assignee of the present case. The Ser. No. 09/823,932 application is hereby incorporated by reference in its entirety.

Concurrent with the move to intermetal dielectric layers having a dielectric constant lower than silicon dioxide, many semiconductor manufacturers are using copper rather than aluminum in the formation of their multilevel interconnect structures. Because copper is difficult to etch in a precise pattern, however, the traditional deposition/selective etch process used for forming such interconnects has become disfavored. Accordingly, a process referred to as a dual damascene process, is used by many semiconductor manufacturers to form copper interconnects. In a dual damascene process, one or more blanket intermetal dielectric layers are deposited and then subsequently patterned and etched to define both the interlayer vias and the interconnect lines. Copper or another conductive material is then inlaid into the defined pattern and any excess conductive material is removed from the top of the structure in a planarization process, such as a chemical mechanical polishing (CMP) process.

The etching of the dielectric layer in such a dual damascene process typically includes two separate lithography steps. One step defines the trenches and another the vias. Photoresist and organic bottom antireflective coating (BARC) films have been found to penetrate the pores of porous low k films so dual damascene lithography techniques for porous low k films typically include the use of a hard mask between the ELK material and the photoresist. One such scheme that has been proposed includes the use of two separate hard masks as shown in FIGS. 1a through 1h.

FIGS. 1a through 1h illustrate one method used in the fabrication of a trench-first dual damascene scheme using a silicon-containing dielectric layer 10 formed over a substrate 2. Substrate 2 may include an already formed conductive line 4, e.g., a copper line, a surrounding dielectric material 6 and a barrier layer separating the two. Dielectric layer 10 may be a single layer or a multilayer dielectric stack. Dielectric layer 10 shown in FIG. 1a includes multiple layers: a barrier layer 12, a via dielectric layer 14 and a porous low k layer 16. Formed over dielectric layer 10 are a first hard mask layer 20, a second hard mask layer 22, a bottom antireflective coating 24 and a photoresist layer 30. In some prior processes known to the inventors where the trench and via portion of underlying dielectric layer 10 are a silicon-containing material, hard mask layer 22 is a silicon nitride or similar layer and layer 20 is a silicon carbide (SiC or SiCN) or similar layer.

Figure 1A:
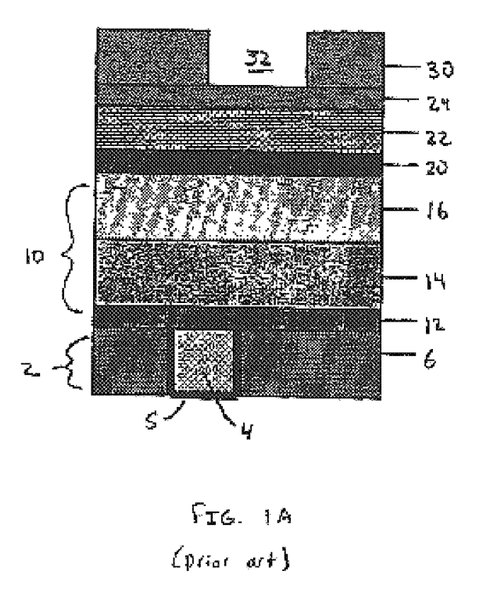
FIGS. 1a–1h are simplified cross-sectional views of a portion of a substrate upon which a dual damascene interconnect structure is being fabricated according to a previously known process.
Figure 1B:
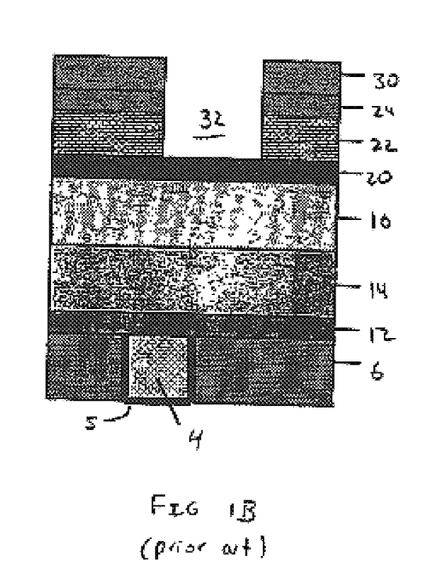
Figure 1C:
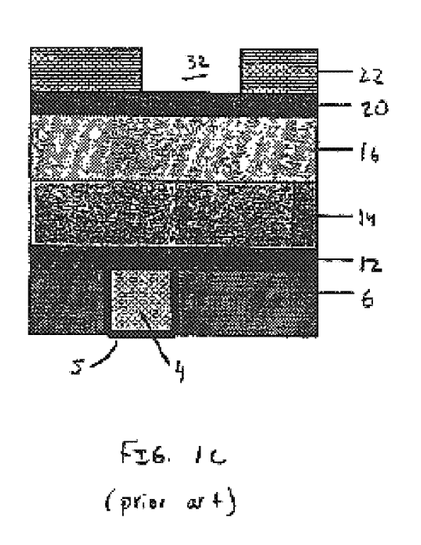

As shown in FIG. 1a photoresist layer 30 is patterned and etched using a metal wiring pattern to form an opening 32. The metal wiring pattern is then transferred into hard mask layer 22 using an appropriate etching process (FIG. 1b). Any remaining photoresist layer 30 is then stripped along with antireflective coating 24 (FIG. 1c). Next, a new bottom antireflective coating 40 and photoresist layer 42 is formed over the substrate such that antireflective coating 40 fills in etched opening 32 (FIG. 1d).

Figure 1D:
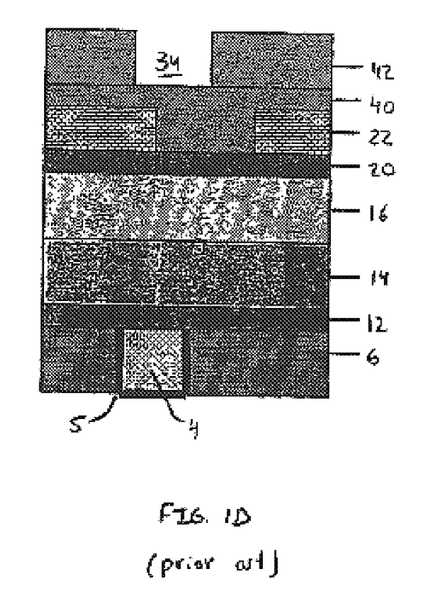
Figure 1E:
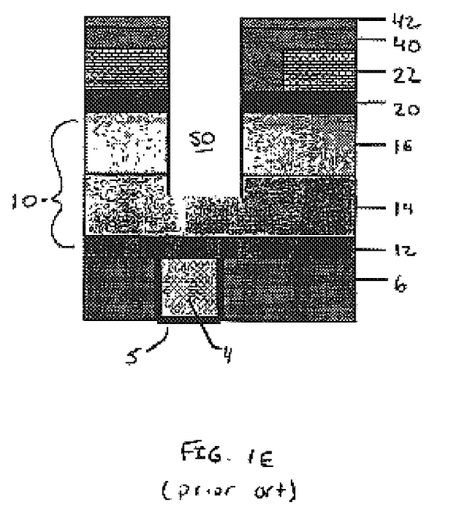
Figure 1F:
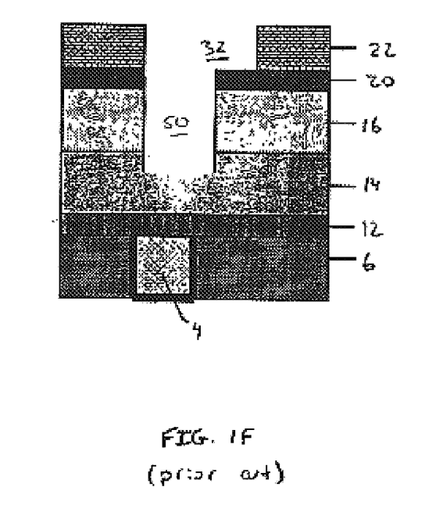
Figure 1G:
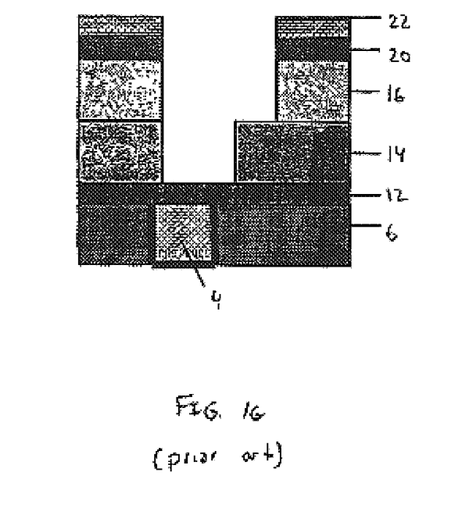
Figure 1H:
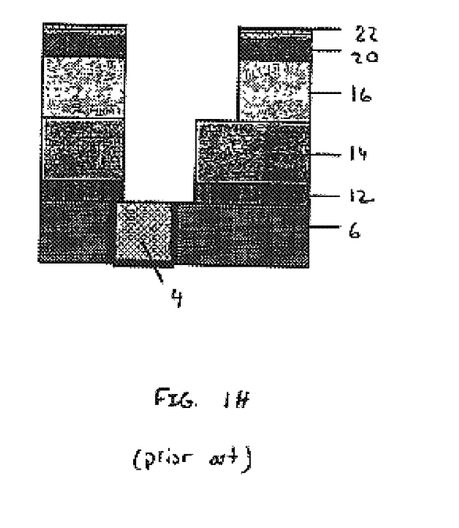

As shown in FIG. 1d, photoresist layer 42 is then patterned and etched according to a via pattern to form an opening 34. The via pattern is then transferred into dielectric stack 10 using photoresist layer 42 as the pattern (FIG. 1e) and afterwards, photoresist layer 42 and antireflective layer 40 are stripped leaving a partially formed via 50 and a larger opening 32 (FIG. 1f). Next, the desired trench 52 and via 50 are etched into low k dielectric layer 10 (FIG. 1g) and barrier layer 12 is etched through to complete the etched via formation (FIG. 1h). Once the formation of via hole 50 and trench 52 are completed, the structure can be filled with copper or another conductive material. The filled structure is then subjected to a planarization step, such as a CMP step, to complete the formation of the interconnect structure. In the completed structure the top of the just-formed conductive line is essentially even with the top of dielectric layer 10.

While the above described process can be used to successfully form dual damascene structures for some integrated circuits, it is not without its limitations. For example, in some applications hard mask layer 22 is required to have a thickness in the range of 1500 Å to 5000 Å in order to remain in place during the etching steps shown in FIGS. 1f, 1g and 1h. Such a relatively thick layer is required for the scheme because etch chemistry selectivity issues and physical sputtering. If the layer is too thin, it will be etched entirely away during the etching steps shown in FIGS. 1f–1h, which in turn may cause the complete loss of hard mask layer 20 during the subsequent CMP process. The loss of hard mask layer 20 during CMP may in turn cause the CMP slurry to intrude into the porous low k dielectric material causing material and defect issues. Similarly, hard mask layer 22 is subject to sputtering effects during the etching processes shown in FIGS. 1f–1h. If the layer is too thin, such sputtering may result in the corner chopping and critical dimension loss in the underlying etched features (via 50 and trench 52). This in turn may result in shorting of conductive lines and/or other problems.

The requirement of such a relatively thick hard mask layer 22 however leads to lithography issues. For example, via opening 34 is patterned inside, or at least partially inside, previously etched and subsequently filled opening 32. The topography created by this hard mask trench etch/fill process may present depth of focus issues during the subsequent lithography process of photoresist layer 42. This is especially true as such dual damascene schemes for low k films are expected to be used in processes that include minimum feature sizes of 0.15 microns and smaller thereby using radiation wavelengths of 193 nm or less for the lithography steps.

Figure 2:
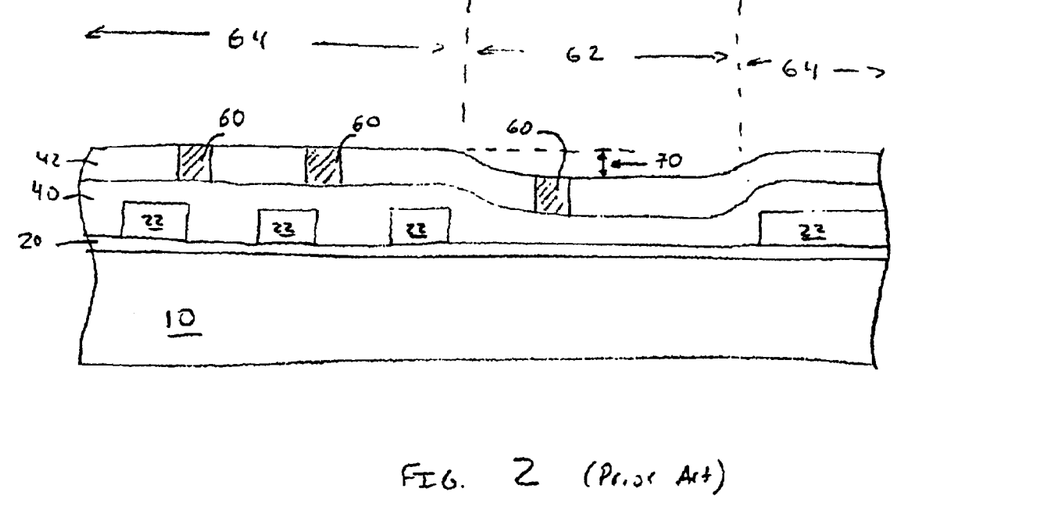
FIG. 2 is a simplified cross-sectional view of an expanded portion of the substrate shown in FIG. 1d prior to the patterning of the photoresist layer shown therein.

FIG. 2, is a simplified cross-sectional drawing of a substrate showing the possible topography of antireflective layer 40 and photoresist layer 42 just prior to the etching of opening 34 shown in FIG. 1d. Photoresist layer 42 includes areas 60 that are to be developed by exposing the corresponding portions of the photoresist layer to appropriate radiation. As shown in FIG. 2, antireflective coating 40 is generally not planar having a recessed portion 62 in an area corresponding to particularly large opening 32 of hard mask layer 22 and raised portions 64 corresponding to areas of the substrate having small trenches or no trenches at all. The uneven topography of layer 40 results in a similarly uneven topography for photoresist layer 42 and a height difference 70 between the top surface of layer 42 in areas 64 as compared to the top of layer 42 in area 62.

The size of height difference 70 is in part due to the thickness of hard mask layer 22. A thinner hard mask layer 22 enables the formation of more planar layers 40 and 42. When height difference 70 is greater than or close to the depth of focus (DOF) of the radiation used to pattern layer 42, portions of layer 42 may not be properly exposed during the patterning process. This, in turn, may result in underdeveloped photoresist and incorrectly dimensioned vias and/or vias that are not opened uniformly all across the wafer.

Additionally, there is an etching issue with this scheme. For vias located in region 64, the portion of antireflective coating 40 that needs to be etched during the via etch step (FIG. 1E) is thicker than the portion of layer 40 that needs to be etched for vias in region 62. As a result, the etched via depth may differ in the two regions which can cause low via yield and reliability issues.

Accordingly, it can be seen that improvements and/or alternative schemes for forming dual damascene structures using porous low dielectric constant films are desirable.

BRIEF SUMMARY OF THE INVENTION

Embodiments of the present invention pertain to a method for forming a dual damascene structure in an integrated circuit. Some embodiments of the invention minimize the thickness of the hard mask structure used to pattern a dual damascene structure by employing an amorphous silicon layer as the second layer of the hard mask structure. Such a layer can provide a higher etch selectivity to the silicon-containing trench and/or via dielectric material etched in damascene processes than provided by some previously used hard mask layers. Higher etch selectivity allows for a thinner hard mask layer, which in turn, reduces the photoresist development and via etch problems associated with some previously known processes.

One embodiment of the method of the invention forms a dual damascene structure on a substrate having a dielectric layer already formed thereon by depositing a first hard mask layer over the dielectric layer and depositing an amorphous silicon hard mask layer on the first hard mask layer. Afterwards, formation of the dual damascene structure is completed by etching a metal wiring pattern and a via pattern in the dielectric layer and filling the etched metal wiring pattern and via pattern with a conductive material. In one embodiment the amorphous silicon material includes between 70–90 atomic percent silicon and 10–30 atomic percent hydrogen.

In some embodiments, the dielectric layer comprises inorganic silicon-containing trench and/or via dielectric portions and the metal wiring and via patterns are etched into the layer using a fluorine-containing plasma that exhibits an etch selectivity of at least 6:1 between the dielectric material being etched and the amorphous silicon hard mask layer. In some specific embodiments the inorganic silicon-containing trench dielectric layer is a porous oxide film deposited by spin-on methods and the inorganic silicon-containing via dielectric layer is a carbon-doped silica glass film deposited by chemical vapor deposition (CVD) techniques.

According to another embodiment of the method of the invention, a dual damascene structure is formed over a substrate having a first interconnect layer already formed thereon. The method forms a barrier dielectric layer over the first interconnect layer and forms a silicon-containing via dielectric layer over the barrier dielectric layer. Next, a silicon-containing porous low dielectric constant layer is formed over the via dielectric layer and first and second hard mask layers are formed over the porous low dielectric constant layer, respectively, where the second hard mask layer is an amorphous silicon material. A first antireflective coating is then formed over the second hard mask layer. A photoresist layer is then formed over said the antireflective coating and patterned in accordance with a metal wiring pattern to expose selected portions of the first antireflective coating. The metal wiring pattern is then transferred into the first antireflective layer and the second hard mask layer using appropriate etching processes and then the photoresist layer and the first antireflective coating are removed with an appropriate stripping process. Afterwards, a second antireflective coating and then second photoresist layer are formed over the patterned second hard mask layer. The second photoresist layer is patterned in accordance with a via pattern to expose selected portions of the second antireflective coating, and then a via hole is etched through the second antireflective coating, through the second and first hard mask layers and into at least a portion of the porous low dielectric constant layer. The second photoresist layer and second antireflective coating are then removed using an appropriate stripping process and the metal wiring pattern is etched into the porous low dielectric constant layer while the via pattern is transferred into the via dielectric layer. Finally, the barrier dielectric layer is opened in the via to expose portions of the first interconnect layer and the etched via and trench are filled with a conductive material.

These and other embodiments of the present invention, as well its advantages and features, are described in more detail in conjunction with the description below and attached figures.

DETAILED DESCRIPTION OF THE INVENTION

As mentioned above, embodiments of the present invention pertain to a method for forming a dual damascene structure in an integrated circuit. Embodiments of the invention are particularly useful for integrated circuits in which the trench and via strata portions of the dielectric layers are inorganic, silicon-containing material. Also, some embodiments of the invention are particularly useful when one or more of the trench or via dielectric layers used in the dual damascene structure is a porous low dielectric constant material, such as a mesoporous silica material. Other embodiments of the invention, however, can be used with other porous low k materials, such as aerogels, xerogels, zeolites as well as with other nonporous dielectric materials, such as nonporous silicon oxide materials, fluoro silicate glass (FSG) materials, carbon-doped silica glass and others.

Some embodiments of the invention pertain to forming a dual damascene structure using a trench-first etching scheme and a hard mask stack of two distinct hard mask layers where the top hard mask layer is an amorphous silicon layer. The hard mask stack is formed over the dielectric material being etched. As will be appreciated by a person of skill in the art, one aspect of the invention lies in the relationship between the materials used in the hard mask layers and the various etch chemistries used to selectively etch desired patterns in the layers and in the underlying dielectric material.

The upper hard mask layer protects the lower hard mask layer during various intermediate etch steps that etch a metal wiring pattern and via pattern into the underlying dielectric layer(s) that make up the final dual damascene structure. The bottom hard mask layer, on the other hand, protects the underlying dielectric material, e.g., the porous low k material, during a subsequent CMP processing step in which the metal or other type of conductor that is used to fill the damascene structure is planarized. In one embodiment, the bottom hard mask layer in the dual-layer hard mask stack is a silicon-containing layer such as silicon nitride, silicon oxynitride, silicon carbide (SiC), or carbon-doped silica glass (SiOC or SiCOH) layer.

The amorphous silicon (a-Si) hard mask layer according to the present invention can be deposited according to a variety of techniques. In one embodiment the a-Si hard mask layer is deposited in a plasma-enhanced CVD (PECVD) process from a capacitively coupled plasma of monosilane ($SiH_4$) and molecular hydrogen ($H_2$). In some embodiments, the a-Si layer has a hydrogen content of between 2–50 atomic percent. In other embodiments, the a-Si layer has a hydrogen content of between 10–30 atomic percent and a silicon content of between 70–90 atomic percent.

Typically, a-Si films have low reflectivity and high absorbtion characteristics which make the films ideal for the use of solar cells. An amorphous silicon layer used as a hard mask film in embodiments of the present invention, however, is optimized to improve the film's transparency so that lithography tools can see through the film and recognize alignment marks in an underlying copper or similar conductive layer.

The present inventors have found that in order to improve the transparency of the a-Si layer the deposition process is optimized in one embodiment by using relatively low RF power during deposition (generally, lower RF settings translate to a more transparent film). Lower RF settings also help reduce the stress of the deposited layer and improve its adhesion to the underlying hard mask layer. The actual values of appropriate RF power will depend on the type of chamber used to grow the a-Si film as well as other desired film properties and can be readily determined by a person of skill in the art.

Figure 3:
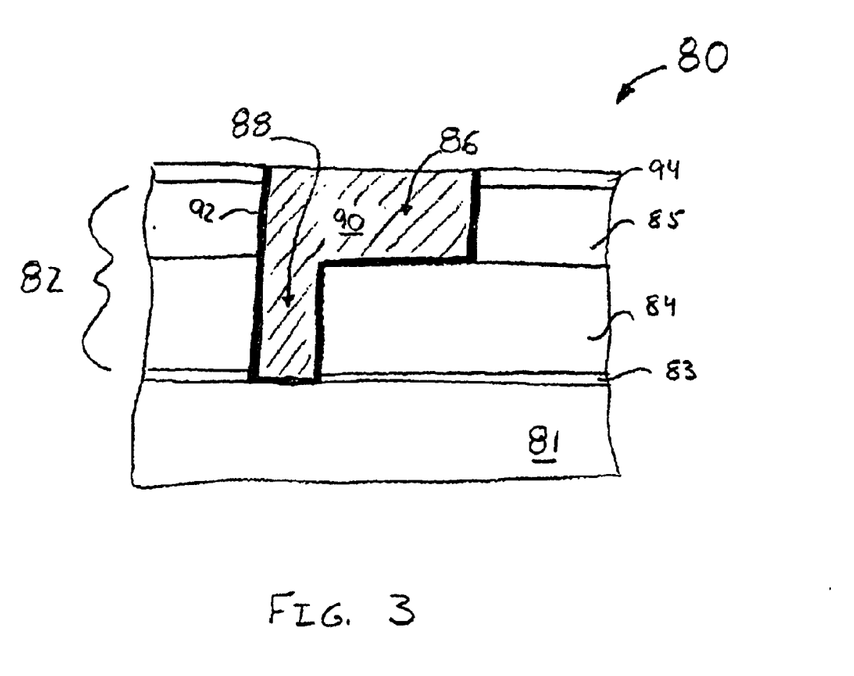
FIG. 3 is an example of a dual damascene structure fabricated according to one embodiment of the present invention.

One example of a dual damascene structure 80 fabricated according to an embodiment of the invention is shown in FIG. 3. Structure 80 includes a dielectric layer 82 deposited over a substrate 81. In this embodiment, dielectric layer 82 is a multilayer dielectric that includes a barrier layer 83, a silicon-containing via dielectric layer 84 and a silicon-containing trench dielectric layer 85. In other embodiments, dielectric layer 82 may include more or fewer layers as would be understood by a person of skill in the art. A trench 86 and a via or contact opening 88 are formed within dielectric layer 82. Trench 86 and via/contact opening 88 are both filled with a conductive material 90, such as copper, after they are lined with an appropriate barrier material 92, such as tantalum nitride when the filled conductive material is copper. Also shown in FIG. 3 are portions of a hard mask layer 94 (the bottom hard mask layer in the dual hard mask scheme) that remain after the completion of the dual damascene structure. The portions of layer 94 shown in FIG. 3 protected trench dielectric layer 85 from a CMP or similar polishing step used to remove excess conductive material 90 from the structure. In some embodiments, the bottom hard mask layer is removed from the final structure after the planarization process while in embodiments like the one shown in FIG. 3, it becomes part of the completed dual damascene structure.

Figure 4:
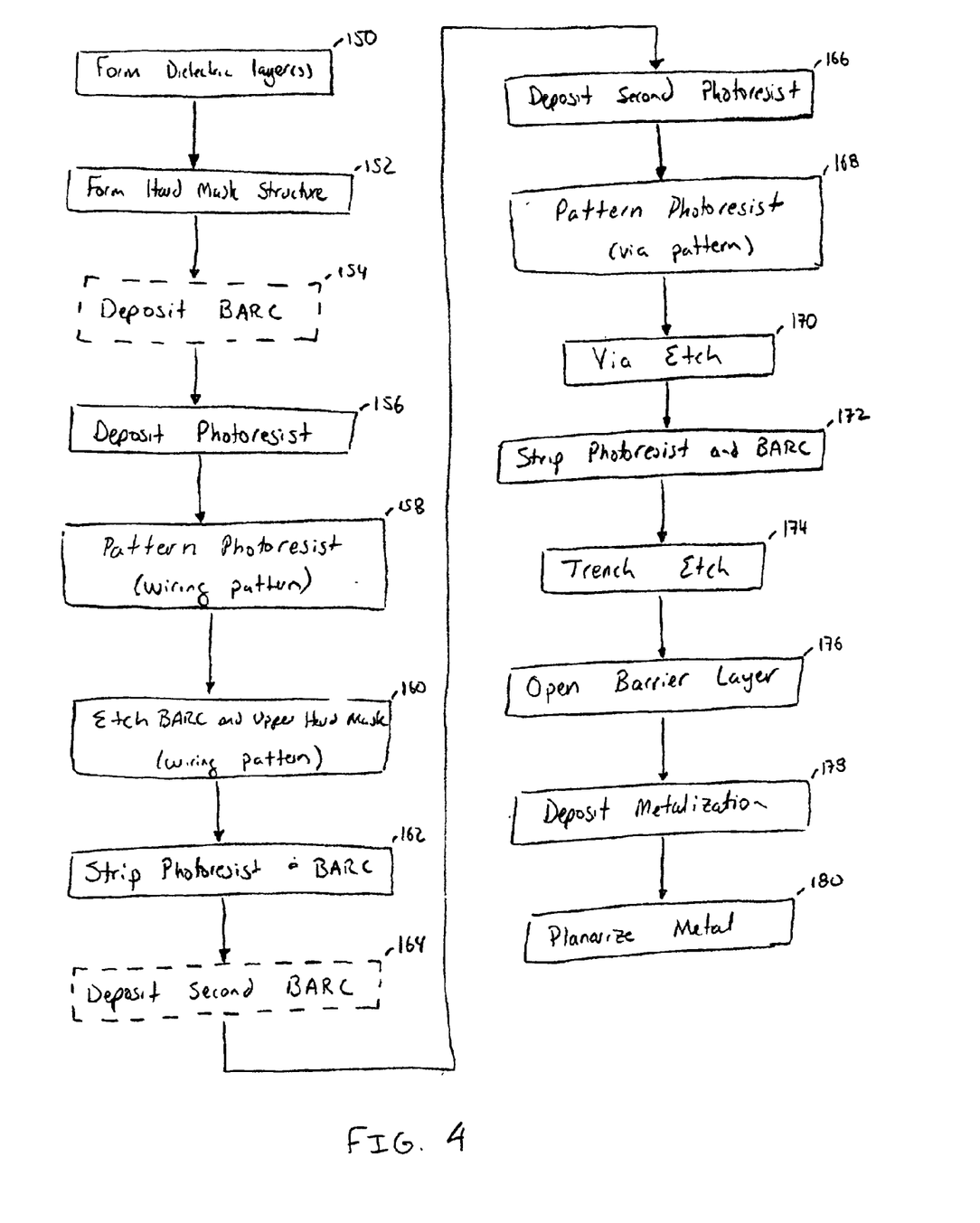
FIG. 4 is a flow chart depicting an exemplary trench-first dual damascene process according to one embodiment of the present invention.

In order to better understand how dual damascene structure 80 is formed according to embodiments of the invention, reference is made below to FIG. 4, which is a flowchart depicting an exemplary dual damascene process according to one embodiment of the invention, as well as to FIGS. 5*a*–5*m*, which are simplified cross-sectional views of a substrate 100 according to an embodiment of the present invention. It is to be understood that the illustrated process is for exemplary purposes only. Other embodiments of the invention may include fewer or additional steps. Also, the illustrated process is typically performed in the context of a larger processing scheme used to form one or more integrated circuits over substrate 100.

Substrate 100 may be any suitable substrate material upon which semiconductor devices are formed, such as a silicon substrate, a germanium substrate, a silicon-germanium substrate and the like. Substrate 100 may also include a plurality of already formed layers over the base substrate material. In the example shown in FIGS. 5*a* to 5*m*, substrate 100 includes an already formed conductive line 104, a surrounding dielectric material 102 and an appropriate conductive barrier layer 105 separating the two. Conductive line 104 may be, for example, a copper line, an aluminum line or another appropriate conductive material. Dielectric material 102 may be a low k dielectric material as discussed above and barrier layer 105 may include one or more barrier and seed layers as appropriate based on the material used for conductive line 104 and dielectric material 102. In one embodiment where line 104 is an electroplated copper line and dielectric material 102 is a mesoporous silica film, barrier layer 105 includes a tantalum nitride barrier layer and a chemical vapor deposition (CVD) or physical vapor deposition (PVD) copper seed layer.

Figure 5A:
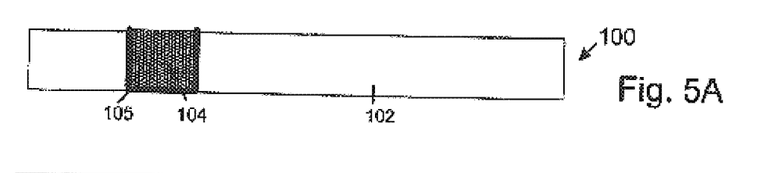
FIGS. 5a–5m are simplified cross-sectional views of a substrate being processed according to the sequence of steps set forth in FIG. 4.
Figure 5B:
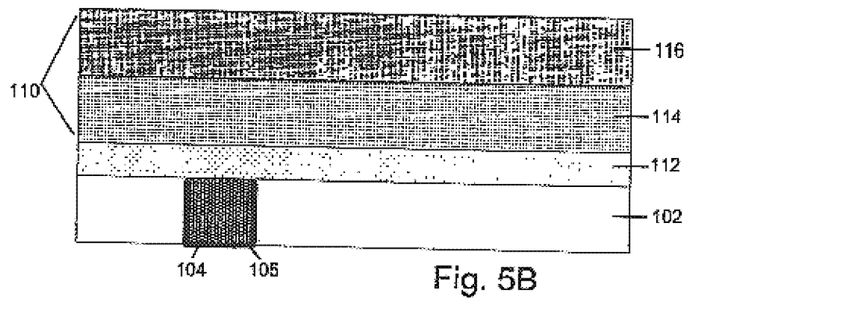

A dual damascene process according to this embodiment of the invention begins with the formation of a dielectric layer 110 over copper line 104 and dielectric layer 102 (step 150). Dielectric layer 110 may be a multilayer dielectric stack as discussed above with respect to FIG. 3. For example as shown in FIG. 5*b*, dielectric layer 110 may include a barrier dielectric layer 112, a via dielectric layer 114 and a porous low k layer 116. In one embodiment, barrier layer 112 is a silicon nitride or silicon carbide layer, such as a BloK™ film (barrier low k dielectric) developed by Applied Materials; via dielectric layer 114 is a carbon-doped silica layer, such as a Black Diamond™ film developed by Applied Materials and trench dielectric layer 116 is a mesoporous silica film. It is to be understood, however, that a variety of different materials can be used to form dielectric layer 110. In other embodiments, layer 110 is a single layer of dielectric material or a single type of material for the via and trench dielectric layers deposited over an appropriate barrier layer. In still other embodiments, the via dielectric layer may include an etch stop layer, such as a BloK™ layer or similar film, between the via and trench dielectric layer.

Figure 5C:
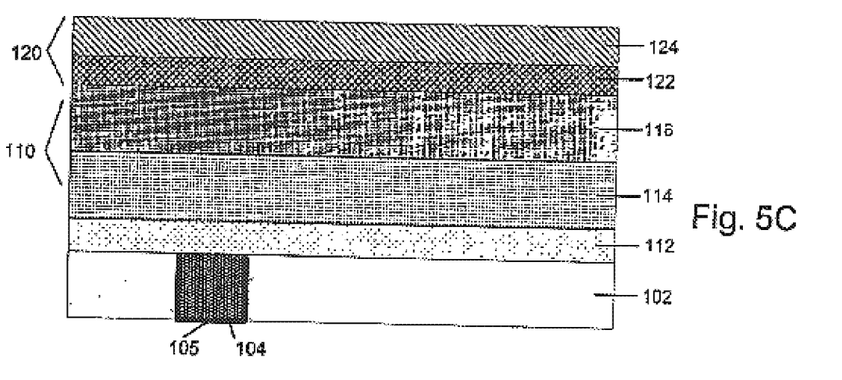

Referring to FIG. 5*c*, a dual layer hard mask structure 120 is formed over dielectric layer 110 (step 152). Hard mask structure 120 includes a first, lower hard mask layer 122 and a second, upper hard mask layer 124. As already discussed, upper hard mask layer 124 is an amorphous silicon layer. Also, one important aspect of the present invention is the different physical properties that each of layers 122 and 124 exhibit and the relationship between these properties and the etch chemistries used to subsequently pattern the layers and the underlying dielectric layer 110. In one embodiment, layer 122 is generally a nonporous, silicon-containing film. In some embodiments layer 122 is a BloK™ film. Such a film includes silicon, carbon and nitrogen and has a dielectric constant in the range of 4.0–5.0. It is generally desirable that the dielectric constant of layer 122 be relatively low since portions of layer 122 remain in the damascene structure after its completion in some embodiments (see FIG. 3, layer 86). Thus, in other embodiments layer 122 is a carbon-doped silica layer, such as a Black Diamond™ film, that has a dielectric constant of between about 2.8–3.1.

Additionally, in embodiments where layer 122 is deposited directly over a mesoporous silica or similar film, it is preferable that the process used to deposit layer 122 not include an oxygen-based plasma because excited oxygen species in the plasma may damage the mesoporous silica layer. In one embodiment, layer 122 is a BloK™ layer deposited from a non-oxidizing plasma that includes tetramethylcyclotetrasiloxane (TMCTS) as a silica source. Also, layer 122 acts as a capping layer that protects dielectric layer 110 from the slurry used in the CMP step used to planarize copper deposited within the damascene structure (see FIG. 3, layer 94). Thus, layer 122 should have a low CMP polish rate compared to copper or any other conductive material used to complete the damascene structure.

Layer 124 is used to pattern at least a portion of dielectric film stack 110 during the subsequent trench and via etch step. Thus, layer 124 needs to exhibit good etch selectivity to both dielectric stack 110 and hard mask layer 122. In one embodiment, layer 124 is an amorphous silicon film having a silicon content of between 70–90 atomic percent and a hydrogen content of between 10–30 atomic percent. Such a film may be deposited, for example, by a PECVD process in which the process gas is $SiH_4$ and $H_2$.

Figure 5D:
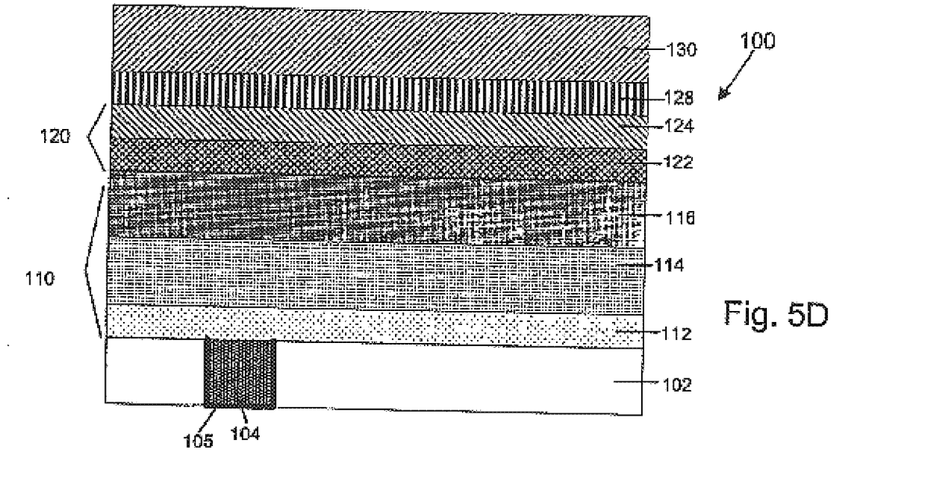

Referring to FIG. 5*d*, after the formation of mask structure 120, an optional bottom antireflective coating 128 is formed (step 154). In one embodiment bottom antireflective coating 128 is an organic material that is deposited using spin-on techniques known to those of skill in the art. Next, a photoresist layer 130 is formed over layer 128 (step 156).

Figure 5E:
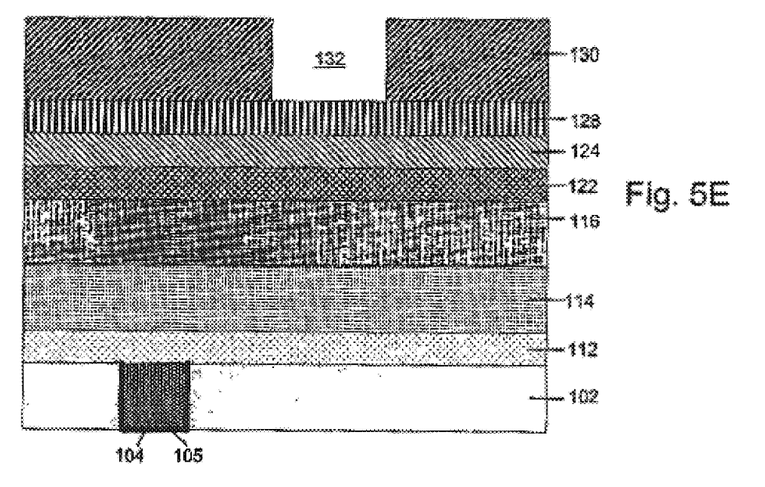
Figure 5F:
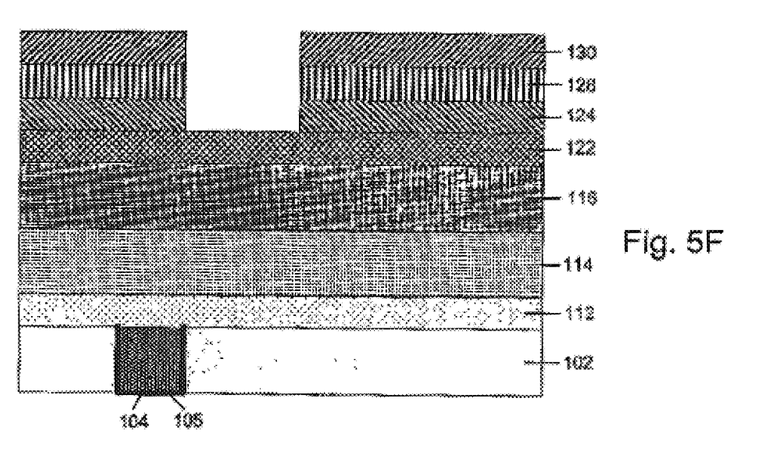
Figure 5G:
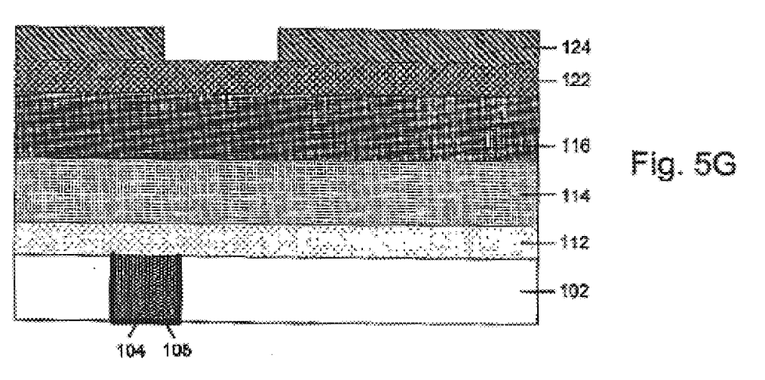

Referring to FIG. 5*e*, photoresist layer 130 is then patterned using a metal wiring pattern to form an opening 132 using techniques that are well known to those of skill in the art (step 158). The metal wiring pattern is transferred into the antireflective coating 128, if present, and hard mask layer 124 as shown in FIG. 5*f* (step 160) with an anisotropic etch process. In some embodiments, layers 128 and 124 are etched in a single step, while in other embodiments they are etched separately. One example of an etching process that can be used in step 160 is a multistep process that etches the antireflective layer 128 and a first portion of the hard mask layer 124 using a CF$_4$ plasma and etches the remaining portion of layer 124 using a plasma containing Ar, CHF$_3$ and O$_2$. The remaining photoresist and/or BARC is stripped using a suitable strip process (step 162, FIG. 5g), for example, an oxygen plasma or a multistep strip process in which a plasma of CF$_4$ and O$_2$ is followed by an oxygen only plasma.

Figure 5H:
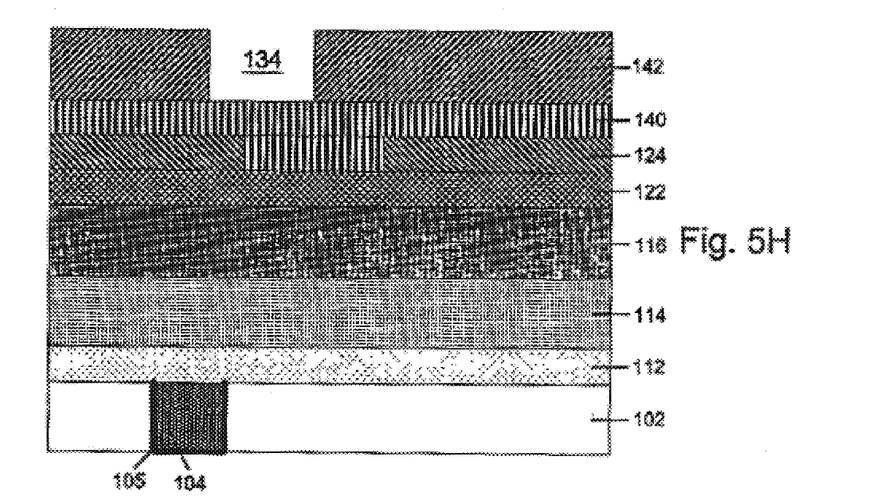

Referring to FIG. 5h, next a new organic bottom antireflective coating 140 and photoresist layer 142 are formed over the substrate such that antireflective coating 140 fills in etched opening 132 (steps 164 and 166). As shown in FIG. 5h, photoresist layer 142 is then patterned according to a via pattern to form an opening 134 (step 168) using a technique similar to the one used to pattern photoresist layer 130. Embodiments of the invention make the lithography process of step 168 more robust than the process described with respect to FIGS. 1a–1h because the step height of layer 124 can be reduced as compared to the step height of layer 22 to etch the same depth trenches in the underlying dielectric layer(s).

Figure 5I:
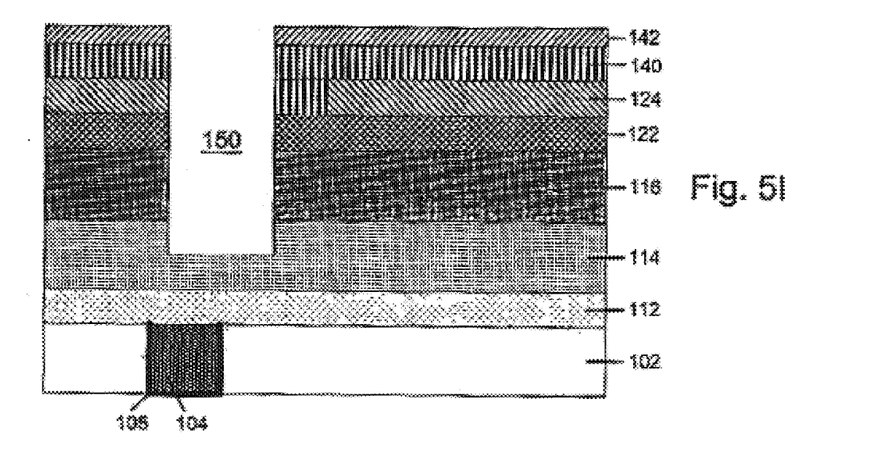

The via pattern is then transferred into dielectric stack 110 using photoresist layer 142 as the etching mask to form a partially formed via 150 as shown in FIG. 5i (step 170). Etch selectivity between photoresist layer 142 and the underlying materials etched during step 170 should be maximized in order to allow via 150 to be etched fairly deeply into dielectric stack 110. In some embodiments the depth of via etch step 170 is set based on the time that is required to etch trench 152 to its required depth in subsequent etch step 174 (shown in FIG. 5k). Basically, etch step 174 should etch trench 152 to its desired depth and clear all the remaining via dielectric layer 114 in via 150 stopping on the via etch stop, dielectric barrier layer 112. In an alternative embodiment, step 174 and 176 are combined into a single step that etches and opens barrier layer 112 at the same time trench 152 is etched.

Figure 5J:
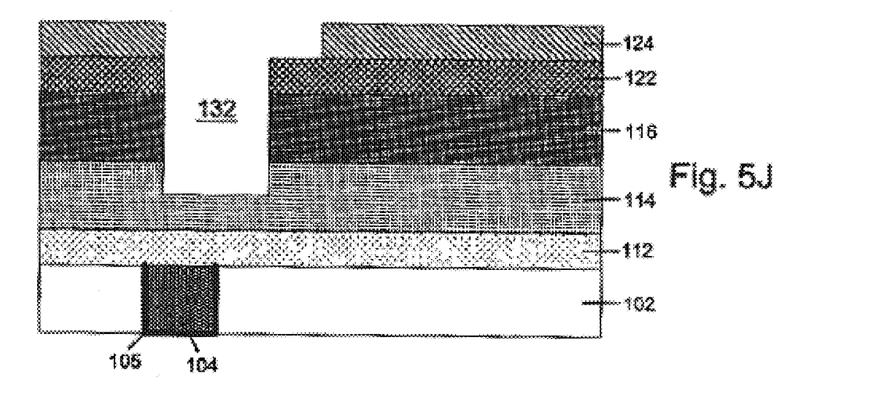

Referring to FIG. 5j, after step 170 photoresist layer 142 and antireflective layer 140 are stripped thereby reopening opening 132 (step 172). The stripping process should not damage any exposed portions of dielectric stack 110 including porous low k layer 116 and should not remove hard mask layer 122 as that is needed to protect porous low k a layer 116 during step 180. In one embodiment, stripping step 172 is performed by an anisotropic strip (e.g., an NH$_3$ plasma strip) or an H$_2$ plasma strip. In one particular embodiment the NH$_3$ strip step is carried out in an eMAX chamber, outfitted for 200 mm wafers, manufactured by Applied Materials using a NH$_3$ flow rate of 200 sccm, a pressure of 80 mTorr and an RF power level of 350 Watts.

Figure 5K:
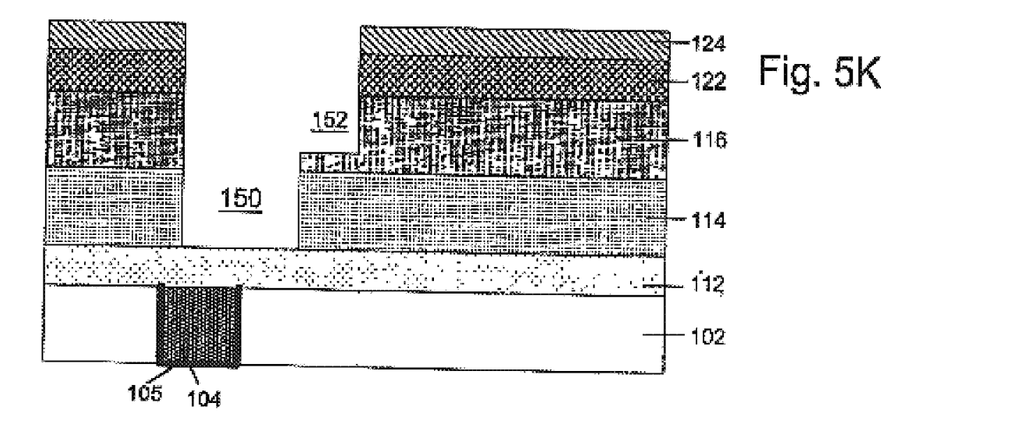

The desired trench 152 and via 150 are then etched into low k dielectric layer 110 as shown in FIG. 5k stopping on dielectric layer 112 (step 174) using, for example, a plasma formed from a fluorocarbon gas. Examples of suitable etchant gases for inorganic, silicon-containing dielectric layers include Ar/C$_4$F$_8$/O$_2$, Ar/C$_4$F$_8$/CH$_2$F$_2$ or CF$_4$/N$_2$. In some embodiments, a separate first etch step is used to etch the exposed portion of layer 122. For example, when layer 122 is a BloK™ film, one embodiment of the invention includes an initial Ar/CHF$_3$/O$_2$/CF$_4$ etch step to remove the exposed BloK™ material and then switches to an Ar/C$_4$F$_8$/O$_2$ process to complete the etching of layers 116 and 114. In some embodiments the etch process is selective between trench dielectric layer 116 and via dielectric layer 114 in order to stop at the bottom of the trench.

Because a-Si hard mask 124 is more different in composition to the layers in dielectric stack 110 than is hard mask 22 used to mask the substrate during a corresponding step in the prior art process of FIGS. 1a–1h, etch step 174 can be designed to have a greater etch selectivity between layer 124 and stack 110 than if a layer having the characteristics of hard mask 22 was employed. In some embodiments the etch selectivity between a-Si layer 124 and dielectric stack 110 is at least 6:1 during a production process. Such an etch selectivity can be obtained using any of the etchant gases discussed above with respect to step 174. As can be appreciated by a person of skill in the art, having such a relatively high etch selectivity at this step allows layer 124 to be considerably thinner than layer 22 in the prior art process. In some embodiments layer 124 is between 500–1500 Å thick for dual damascene processes having minimum feature sizes of 0.15 micron and less.

Figure 5L:
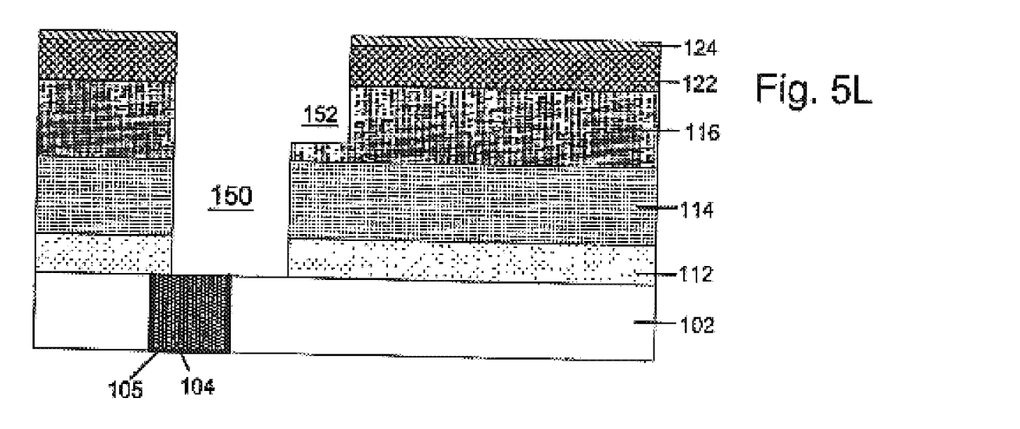

Next, dielectric barrier layer 112 is etched through to complete the etched via formation as shown in FIG. 5l (step 176). Layer 124 protects underlying layers 122, 116 and 114 during the opening of layer 112. In one embodiment where barrier layer 122 is a BloK™ layer, the barrier layer punch through etch step is an Ar/CHF$_3$/O$_2$/CF$_4$ or a CF$_4$/N$_2$ plasma etching process. As previously discussed, in an alternative embodiment steps 174 and 176 may be combined into a single step to etch/open barrier layer 112 at the same time trench 152 is etched.

Figure 5M:
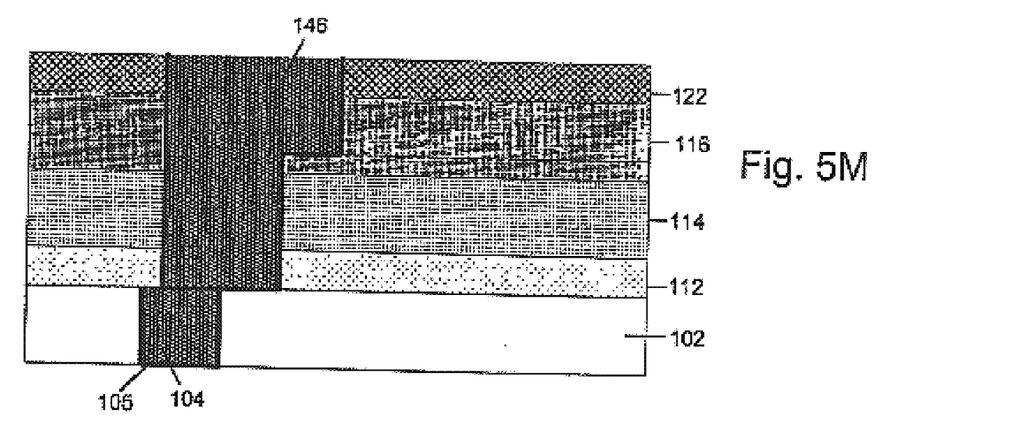

Once the formation of via hole 150 and trench 152 are completed, the structure can be lined with a layer of barrier metal 114, such as tantalum nitride, and filled with copper 146 or another conductive material (step 178). Referring to FIG. 5m, the filled structure is then subjected to a planarization step, such as a CMP step, (step 180) to complete the formation of the interconnect structure and form a structure such as that shown in FIG. 3.

In one embodiment, the CMP step uses a Mirra™ CMP platform, and a multistep process. In the first step (Platen 1) the copper is removed using an appropriate silica-containing slurry and in the second (Platen 2) the thin TaN/Ta liner/barrier is removed using a different silica-containing slurry and a different polishing head. The amorphous silicon layer is conductive and may cause copper line shorts. Accordingly, some embodiments of the invention polish the a-Si layer off during CMP step 180. The a-Si is under the TaN barrier, so some embodiments remove it at the second step, after the barrier is removed using the same slurry. Still other embodiments may include an additional third CMP step that employs a slurry optimized to ensure the removal of the a-Si layer.

In some embodiments layers 122 and 124 are both deposited using chemical vapor deposition methods. Such embodiments allow the dual layer (layer 122 and 124) hard mask stack to be deposited either in a single chamber in an in situ process or in separate dedicated chambers of a single multichamber cluster tool.

In one specific embodiment where layer 122 is a BloK™ or similar film and layer 124 is an amorphous silicon film, each layer is deposited in separate, dedicated chamber situated around a Centura™ or Producer™ mainframe cluster tool manufactured by Applied Materials. In this embodiment, layers 122 and 124 may be deposited using the processes set forth below in Table 1.

TABLE 1

EXEMPLARY DEPOSITION PROCESSES FOR
LAYERS 122 AND 124

| Parameter | Layer 122 | Layer 124 |
|---|---|---|
| Process Gas | TMCTS: 1000 mgm<br>He: 400 sccm | $SiH_4$: 150 sccm<br>$H_2$: 3000 sccm |
| Temp | 350° C. | 350° C. |
| Pressure | 4 Torr | 4.5 Torr |
| Spacing | 300 mils | 400 mils |
| RF Power | 335 Watts | 100 Watts |

In order to test the method of the present invention, the inventors deposited a dual hard mask layer according to the process set forth above where the BloK™ layer was 1000 Å thick and the overlying a-Si layer was also 1000 Å thick. The hard mask layers were deposited over a dielectric film stack that included a 3200 Å mesoporous oxide layer formed over a 5000 Å Black Diamond™ layer and a 500 Å BloK™ layer. In the tests, a wiring trench pattern was etched in the mesoporous oxide layer using the process described above with respect to FIG. 4.

The trench pattern was then successfully etched into the a-Si layer and then into the mesoporous oxide layer using an eMax chamber manufactured by Applied Materials and the parameters set forth below in Table 2. In Table 2 below, where individual steps, such as steps 160, 162 and 174 include different gases and/or processing conditions separated by a dashed line, the steps are multistep processes where the first step of the multistep process is listed to the left of the dashed line and the second step is listed to the right of the dashed line.

TABLE 2

EXEMPLARY ETCH AND STRIP PROCESSES FOR ETCH STEPS 160, 162, 174

| Parameter | Step 160 | | Step 162 | | Step 174 | |
|---|---|---|---|---|---|---|
| Process gas | 100 $CF_4$ | 200 Ar<br>35 $CHF_3$<br>5 $O_2$ | 250 $O_2$ | 250 $O_2$<br>10 $CF_4$ | 10 $CHF_3$<br>10 $O_2$<br>40 $CF_4$<br>90 Ar | 22 $CF_8$<br>400 Ar<br>10 $O_2$ |
| Pressure | 100 mTorr | 50 mTorr | 80 mTorr | 80 mTorr | 200 mTorr | 50 mTorr |
| Power | 700 Watt | 800 Watt | 200 Watt | 200 Watt | 300 Watt | 800 Watt |
| Flux | 20 Gauss | 0 Gauss | 0 Gauss | 0 Gauss | 0 Gauss | 10 Gauss |
| Time | 55 sec | 20 sec | 45 sec | 30 sec | 15 sec | 35 sec |

In other experiments the inventors used the etch process shown in Table 2 above for step 174 and ran it on blanket, unpatterned a-Si wafers for the time it takes to etch a 500 Å BloK™ layer 122 formed over a 4300 Å porous oxide layer 116 using the step 174 process shown in Table 2. In these experiments, between 400–550 Å of a-Si were removed from the a-Si wafer. This translates to an etch selectivity of between about 9:1–12:1 for the 4800 Å combined BloK™+ porous oxide stack to the a-Si hard mask.

On patterned wafers, particularly at the corners of features, the hard mask loss will be more than that on blanket wafers. Accordingly, selectivity numbers may be less for production (patterned) wafers. The inventors have found, however, that etch selectivity values of 6:1 and higher are readily obtainable between the a-Si hard mask layer and the BloK™, porous oxide dielectric stack for patterned wafers. This 6:1 ratio for patterned wafers compares the thickness of BloK™ layer and the dielectric layer with the amount of a-Si loss at the corners of features. It is important to use loss at the corners for this calculation as material is etched at a higher rate at the feature corners as compared to other areas.

As a comparative example, in other embodiments the inventors determined that a $SiO_2$ over $Si_3N_4$ hard mask scheme, the etch selectivity layer is on the order of just 2:1 to 4:1.

The description above is intended to help illustrate the principles of this invention and is not intended to limit the scope of this invention in any way. Also, while the invention has been described with reference to specific examples thereof, it will be apparent to a person of ordinary skill in the art that various changes and modifications can be made to the concepts presented herein without departing from the spirit and scope of the invention. For example, the order of the trench and via etch steps shown in FIG. 4 can be reversed along with the order of other steps set forth in FIG. 4 as appropriate. Also, while the trench and via dielectric layers in the specific examples of the invention discussed above were inorganic silicon-containing dielectric layers, the amorphous silicon dual hard mask scheme of the present invention is also applicable to other types of dielectric layers including CVD and spin-on organic layers. These equivalents and alternatives are intended to be included within the scope of the present invention.

What is claimed is:

1. A method of forming a dual damascene structure on a substrate having a dielectric layer already formed thereon, said method comprising:
    depositing a first hard mask layer over the dielectric layer;
    depositing a second hard mask layer on the first hard mask layer, wherein said second hard mask layer is an amorphous silicon layer; and
    completing formation of the dual damascene structure by:
        (i) using a photoresist layer patterned according to a metal wiring pattern to transfer the metal wiring pattern into said amorphous silicon layer while stopping on said first hard mask layer; (ii) thereafter and prior to etching through said first hard mask layer, depositing a second photoresist layer over the substrate and patterning the second photoresist layer according to a via pattern; (iii) using said second photoresist layer to transfer a via pattern in said dielectric layer and (iv) filling etched portions of the damascene structure with a conductive material.

2. The method of claim 1 wherein said amorphous silicon layer has a silicon content of between 70–90 atomic percent.

3. The method of claim 2 wherein said amorphous silicon layer has a hydrogen content of between 10–30 atomic percent.

4. The method of claim 1 wherein said dielectric layer comprises a via dielectric layer and a trench dielectric layer formed over said via dielectric layer.

5. The method of claim 4 wherein said dielectric layer further comprises a barrier layer formed under said via dielectric layer.

6. The method of claim 5 wherein said dielectric layer further comprises an etch stop layer formed between said via dielectric layer and said trench dielectric layer.

7. The method of claim 1 wherein said first hard mask layer is selected from the group consisting of silicon carbide, silicon nitride, silicon oxynitride and carbon-doped silica.

8. The method of claim 1 wherein said first hard mask layer is a carbon doped silica layer deposited from a plasma that does not include oxygen.

9. The method of claim 1 wherein said completing step further comprises, after filling said etched metal wiring pattern and via pattern with a conductive material, polishing said conductive material using a chemical mechanical polishing step, wherein said first hard mask layer is resistant to said chemical mechanical polishing step.

10. The method of claim 1 wherein the via dielectric is a carbon doped silica film and the trench dielectric is a porous oxide.

11. The method of claim 10 wherein the trench dielectric is a mesoporous silica film.

12. The method of claim 1 wherein said dielectric layer comprises a carbon doped silica glass film and/or a porous oxide film and wherein said metal wiring and via pattern are etched into said dielectric layer using an etch process that has an etch selectivity of at least 6:1 between dielectric layer and the amorphous silicon hard mask layer.

13. The method of claim 12 wherein said dielectric layer comprises a porous oxide trench layer deposited over carbon doped silica glass via dielectric layer.

14. The method of claim 13 wherein said etch process is a multistep etch process that first forms a plasma from an etchant gas comprising $CHF_3$, $CF_4$, $O_2$ and Ar and subsequently forms a plasma from an etchant gas comprising $C_4F_8$, $O_2$ and Ar.

15. A method of forming a dual damascene structure, said method comprising:

provided a substrate having a first interconnect layer formed thereon;

forming a barrier dielectric layer over said first interconnect layer;

forming a silicon-containing via dielectric layer over said barrier dielectric layer;

forming a porous low dielectric constant layer over said via dielectric layer;

depositing a two layer hard mask over said porous low dielectric constant layer, the hard mask consisting of a bottom layer deposited directly on the porous low dielectric constant layer and a top amorphous silicon layer;

forming a first antireflective coating directly over said top hard mask layer;

forming a photoresist layer over said first antireflective coating;

patterning said photoresist layer in accordance with a metal wiring pattern to expose selected portions of said first antireflective coating;

etching said first antireflective layer to transfer said metal wiring pattern from said photoresist layer to said first antireflective coating;

etching said top hard mask layer to transfer said metal wiring pattern to said top hard mask layer, removing said photoresist layer and said first antireflective coating;

forming a second antireflective coating over said patterned top hard mask layer;

forming a second photoresist layer over said second antireflective coating;

patterning said second photoresist layer in accordance with a via pattern to expose selected portions of said second antireflective coating;

etching a via hole through said second antireflective coating, said top and bottom hard mask layers and at least into said porous low dielectric constant layer;

removing said second photoresist layer and said second antireflective coating;

etching said metal wiring pattern into said bottom hard mask layer and said porous low dielectric constant layer and transferring said via pattern into said via dielectric layer; and etching through said barrier dielectric layer in said via to expose portions of said first interconnect layer.

16. The method of claim 15 further comprising filling said etched via and metal wiring pattern with a conductive material.

17. The method of claim 16 wherein said conductive material comprises copper.

18. The method of claim 15 wherein said via dielectric layer comprises porous dielectric material.

19. The method of claim 18 wherein said porous dielectric material comprises a mesoporous silica film.

20. The method of claim 15 wherein said via dielectric layer comprises a carbon doped silica film.

21. The method of claim 15 wherein said via dielectric and said porous low k layers both comprise mesoporous silica films, wherein a dielectric constant of said via dielectric layer is higher than a dielectric constant of said porous low k dielectric layer.

22. The method of claim 15 wherein said second antireflective coating and said second photoresist layer are deposited over the substrate prior to etching through said bottom hard mask layer.

23. A method of forming a dual damascene structure on a substrate having a dielectric layer already formed thereon, said method comprising:

forming an intermetal dielectric structure comprising one or more dielectric layers over the substrate;

depositing a hard mask structure consisting of a bottom hard mask layer and a top amorphous silicon layer over the intermetal dielectric structure;

etching a trench and a via in the intermetal dielectric structure by forming a first photoresist layer over the hard mask structure, patterning the first photoresist layer according to a first pattern; transferring the first pattern into the amorphous silicon hard mask layer while using the bottom hard mask layer as an etch stop and depositing a second photoresist layer over the substrate prior to etching through the bottom hard mask layer.

24. The method of claim 23 wherein the step of etching a trench and via further comprises patterning the second photoresist layer according to a second pattern and transferring the second pattern into the intermetal dielectric structure.

25. The method of claim 24 further comprising filling the etched trench and via with a conductive material.

26. The method of claim 25 wherein the bottom hard mask layer is selected from the group consisting of silicon carbide, silicon nitride, silicon oxynitride and carbon-doped silica.

* * * * *